(12) United States Patent
Mueller et al.

(10) Patent No.: US 9,711,331 B2
(45) Date of Patent: *Jul. 18, 2017

(54) FREQUENCY TUNING FOR PULSED RADIO FREQUENCY PLASMA PROCESSING

(71) Applicant: Advanced Energy Industries, Inc., Fort Collins, CO (US)

(72) Inventors: Michael Mueller, Loveland, CO (US); Myeong Yeol Choi, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 15/403,021

(22) Filed: Jan. 10, 2017

(65) Prior Publication Data

US 2017/0133203 A1 May 11, 2017

Related U.S. Application Data

(63) Continuation of application No. 14/320,268, filed on Jun. 30, 2014, now Pat. No. 9,544,987.

(51) Int. Cl.
*H01J 37/32* (2006.01)

(52) U.S. Cl.
CPC .... *H01J 37/32155* (2013.01); *H01J 37/3299* (2013.01); *H01J 37/32146* (2013.01); *H01J 37/32174* (2013.01); *H01J 37/32183* (2013.01); *H01J 37/32935* (2013.01)

(58) Field of Classification Search
CPC ............. H01J 37/3299; H01J 37/32802; H01J 37/32174
See application file for complete search history.

(56) References Cited

U.S. PATENT DOCUMENTS

| 6,383,554 | B1* | 5/2002 | Chang | H01J 37/32082 427/10 |
| 2009/0237170 | A1* | 9/2009 | Van Zyl | H01J 37/32082 331/127 |
| 2013/0214683 | A1* | 8/2013 | Valcore, Jr. | H01J 37/32082 315/111.21 |

* cited by examiner

*Primary Examiner* — Douglas W Owens
*Assistant Examiner* — Pedro C Fernandez
(74) *Attorney, Agent, or Firm* — Neugeboren O'Dowd PC

(57) ABSTRACT

This disclosure describes systems, methods, and apparatus for pulsed RF power delivery to a plasma load for plasma processing of a substrate. In order to maximize power delivery, a calibration phase using a dummy substrate or no substrate in the chamber, is used to ascertain a preferred fixed initial RF frequency for each pulse. This fixed initial RF frequency is then used at the start of each pulse during a processing phase, where a real substrate is used and processed in the chamber.

17 Claims, 10 Drawing Sheets

FREQUENCY TUNING FOR PULSED RADIO FREQUENCY PLASMA PROCESSING

CLAIM OF PRIORITY UNDER 35 U.S.C. §119

The present application for patent is a continuation of U.S. Non-Provisional application Ser. No. 14/320,268 entitled "FREQUENCY TUNING FOR PULSED RADIO FREQUENCY PLASMA PROCESSING" filed Jun. 30, 2014 and assigned to the assignee hereof and hereby expressly incorporated by reference herein.

FIELD OF THE DISCLOSURE

The present disclosure relates generally to pulsed radio frequency power. In particular, but not by way of limitation, the present disclosure relates to systems, methods and apparatuses for frequency tuning a power generation system for igniting and sustaining a plasma load in a plasma processing chamber.

BACKGROUND

Plasma processing of a substrate often calls for radio frequency (RF) power to be used to sustain the plasma, and sometimes this RF power is provided in a pulsed envelope. During each pulse, frequency tuning of the RF power can be used to optimize power delivery (e.g., by impedance matching). Existing tuning algorithms call for the tuned frequency at the end of a pulse to be used at the start of a subsequent pulse. Yet, the tuned frequency at an end of a pulse is often not well-tuned at the start of a subsequent pulse, leading to a large impedance mismatch at a start of many pulses. This impedance mismatch can disrupt processing recipes or even damage the substrate being processed.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure may be characterized as a method of selecting a fixed initial RF frequency for each of a plurality of RF pulses provided to a plasma load. The method can include providing pulsed RF power to a plasma load, where each pulse comprises RF power having a controllable frequency. Also, the providing occurs while a plasma having the plasma load interacts with a dummy substrate in a plasma chamber. The method can further include setting an initial RF frequency at a start of each pulse to a different frequency from the start of the previous pulse such that the initial RF frequency is tuned, pulse to pulse, to minimize a difference between a characteristic indicative of the pulsed RF power and a desired characteristic of the pulsed RF power. The method further includes tuning a frequency of RF power for a remainder of each pulse to minimize a difference between a characteristic of the pulsed RF power and a desired characteristic of the pulsed RF power. The method can further include selecting the initial RF frequency as a fixed initial RF frequency for use in a processing run using a real substrate when tuning of the initial RF frequency between two or more consecutive pulses results in an insignificant improvement in the difference between the characteristic of the pulsed RF power and the desired characteristic of the pulsed RF power.

Other embodiments of the disclosure may also be characterized as non-transitory, tangible computer readable storage medium, encoded with processor readable instructions to perform a method for frequency tuning a power source to optimize delivered power to a plasma load. The method can include setting a frequency of pulsed RF power to a fixed initial RF frequency at a start of multiple pulses of RF power delivered to the plasma load for processing a substrate. The fixed initial RF frequency can be selected by (1) repeatedly adjusting an RF frequency at a start of a plurality of consecutive pulses of RF power delivered to the plasma load when a dummy substrate is in the plasma processing chamber and (2) selecting the RF frequency as the fixed initial RF frequency when the adjusting settles on a steady state RF frequency. The adjusting can be performed so as to minimize a difference between a characteristic indicative of the pulsed RF power and a desired characteristic of the pulsed RF power as compared pulse to pulse. The method can further include tuning the frequency of pulsed RF power for a remainder of each pulse to minimize a difference between a characteristic indicative of the pulsed RF power and a desired characteristic of the pulsed RF power.

Other embodiments of the disclosure can be characterized as a power delivery system comprising a power source, a sensor, and a controller. The power source can be configured to provide pulsed RF power to a plasma load via a matching network. The sensor can be configured to sample a characteristic indicative of the pulsed RF power indicative of delivered power. The controller can be in communication with the sensor and the power source and can comprise a plurality of logical blocks. The logical blocks can comprise a measurement module, an initial frequency comparison module, a frequency control module, and an initial frequency identification module. The measurement module can receive samples of the characteristic indicative of the pulsed RF power from the sensor. The initial frequency comparison module can compare samples of the characteristic indicative of the pulsed RF power at a start of each of a plurality of RF pulses to a desired characteristic of the pulsed RF power at a start of each of the plurality of pulses to determine an error value. The frequency control module can instruct the power source to adjust the initial frequency in order to reduce the error value. The initial frequency identification module can identify the initial frequency as a fixed initial RF frequency when adjustments to the initial frequency at the start of two or more pulses fail to result in further reduction of the error value.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

The word "exemplary" is used herein to mean "serving as an example, instance, or illustration." Any embodiment described herein as "exemplary" is not necessarily to be construed as preferred or advantageous over other embodiments.

For the purposes of this disclosure, "pulsed RF power" is RF power having a power envelope that is pulsed. In other words, multiple periods of RF power are delivered, followed by a period of no power, followed by another set of period of RF power (or a pulse).

To avoid the impedance mismatch that the prior art sees at the start of many pulses, this disclosure describes systems, methods, and apparatus where an initial RF frequency at the start of each pulse is dictated not by the tuned frequency at an end of a preceding pulse, but by a fixed value that remains the same from pulse to pulse. Further, this initial RF frequency can be determined prior to a processing run using a dummy substrate or other means. While this fixed initial RF frequency will still see some impedance mismatch at the start of each pulse due to unavoidable variations at the start of any pulse, the mismatch will on average be far less than seen in the prior art (e.g., compare FIGS. 2 and 3).

In one embodiment, a method is disclosed for identifying an initial RF frequency that maximizes delivered power to the plasma load at a start of each pulse, as identified during a calibration phase, where a dummy substrate, or no substrate, is in the plasma processing chamber. The calibration phase can involve traditional frequency tuning after a start of each pulse, but at the start, the frequency can be tuned from pulse to pulse in order to minimize reflected power or optimize some other characteristic indicative of delivered power. This initial RF frequency can then be used as the initial RF frequency for every pulse during a processing phase—or an actual run—where a real substrate is processed in the plasma processing chamber. In both the calibration and processing phases, after the initial RF frequency is set, traditional frequency tuning as understood by those of skill in the art is implemented for a remainder of each pulse.

Figure 2:
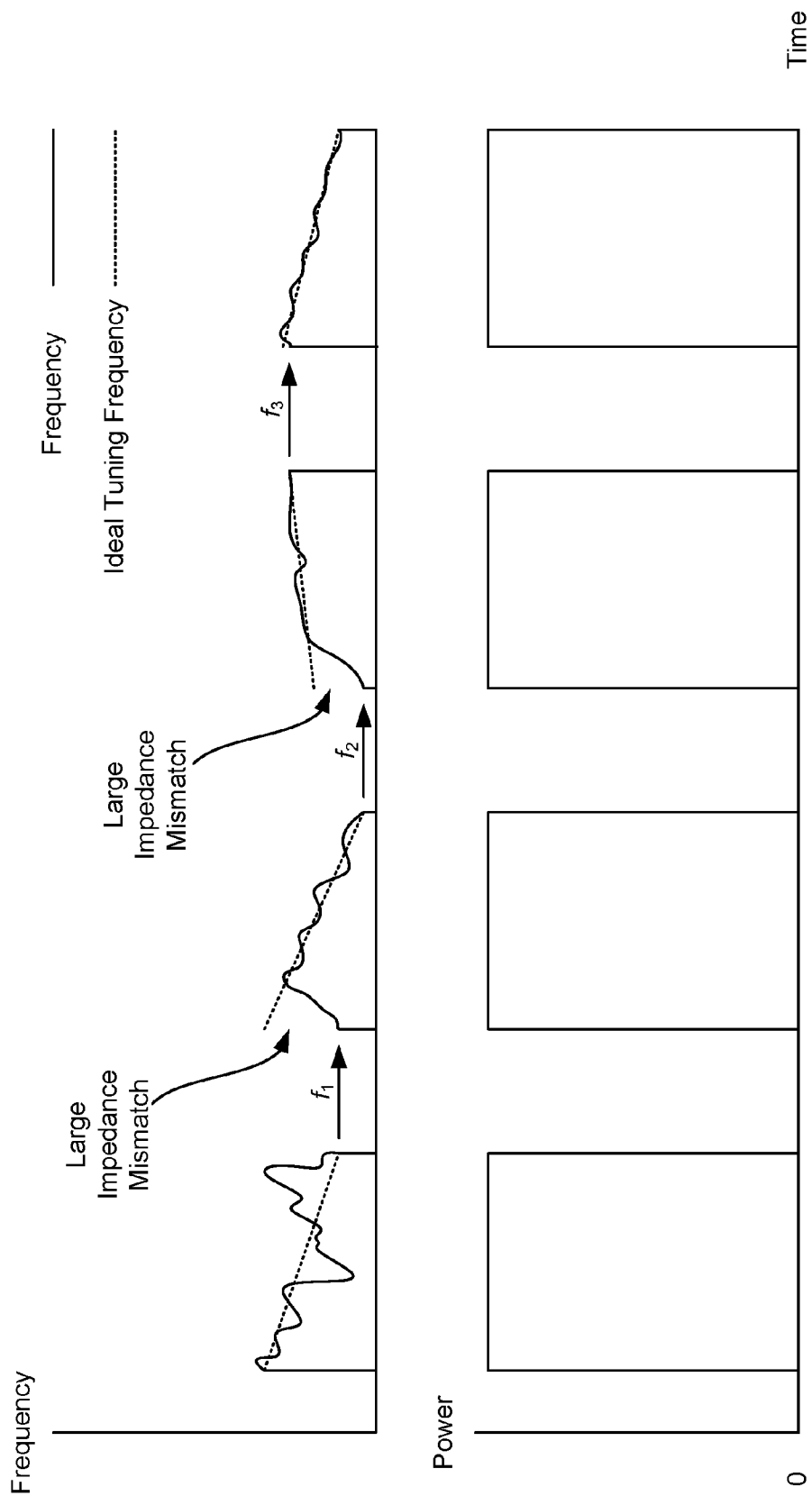
FIG. 2 illustrates the impedance mismatch that can result when traditional frequency tuning methods are used.

FIG. 2 illustrates the impedance mismatch that can result when traditional frequency tuning methods are used. The pulse on and off states can be seen in the lower of the two plots. The frequency at which the RF power is being delivered at any point in time is seen in the upper of the two plots. In the first pulse, the frequency is tuned in a generally downward trending fashion such that the frequency $f_1$ is being used when the pulse turns off. The next pulse sees $f_1$ as the initial RF frequency. Yet, for one of numerous reasons, an ideal tuning frequency (as shown by the dotted lines) is at a much higher frequency, and so starting at $f_1$ leads to a large impedance mismatch (just as starting at $f_2$ at the next pulse leads to a large impedance mismatch). Subsequent tuning during each pulse (after the initial frequency) allows the tuned frequency to approach the ideal tuning frequency, but the initial impedance mismatch is less than ideal.

Figure 3:
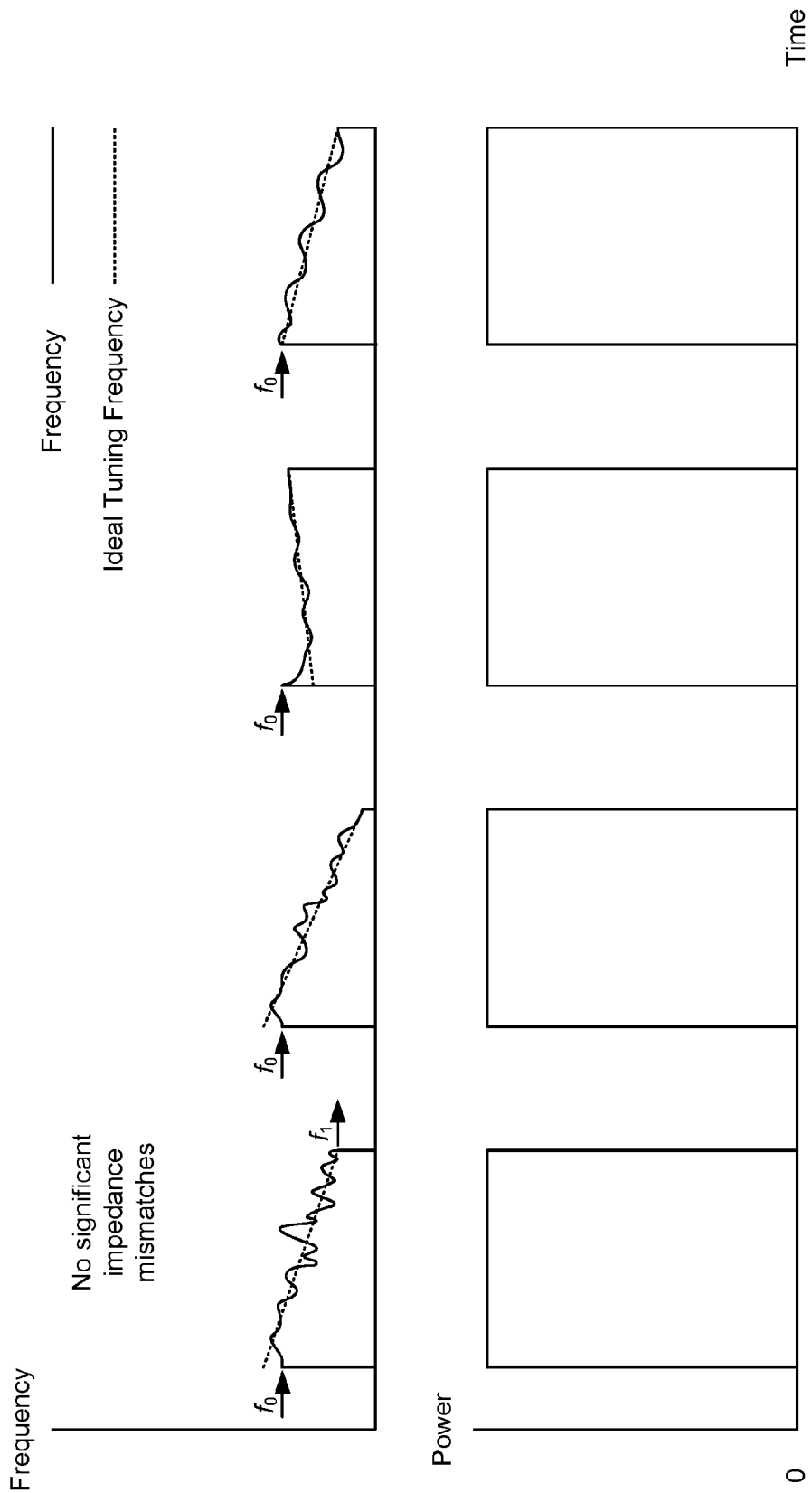
FIG. 3 illustrates a reduced impedance mismatch at the start of pulses where a fixed initial RF frequency is used.

FIG. 3 illustrates a reduced impedance mismatch at the start of pulses where a fixed initial RF frequency is used. The pulse on and off states can be seen in the lower of the two plots while the frequency at which the RF power is being delivered at any point in time is seen in the upper of the two plots. In the first pulse, the frequency is tuned in a generally downward trending fashion such that the frequency $f_1$ is being used when the pulse turns off. Unlike the prior art, instead of using $f_1$ as the initial RF frequency for the next pulse, $f_0$ is again used, and this pattern repeats for the initial RF frequency of each pulse. In this way, a fixed initial RF frequency, $f_0$, can be used for each pulse, where the fixed initial RF frequency, $f_0$, has been preselected as an optimal average starting frequency for pulses. As seen, the result is that the initial RF frequency, $f_0$, is much closer to the ideal tuning frequency at a start of each pulse than if the tuned frequency at an end of a previous pulse was carried over to the start of the next pulse (as in FIG. 2). This causes far less impedance mismatch at the start of pulses and hence more consistent and accurate processing runs.

Figure 4:
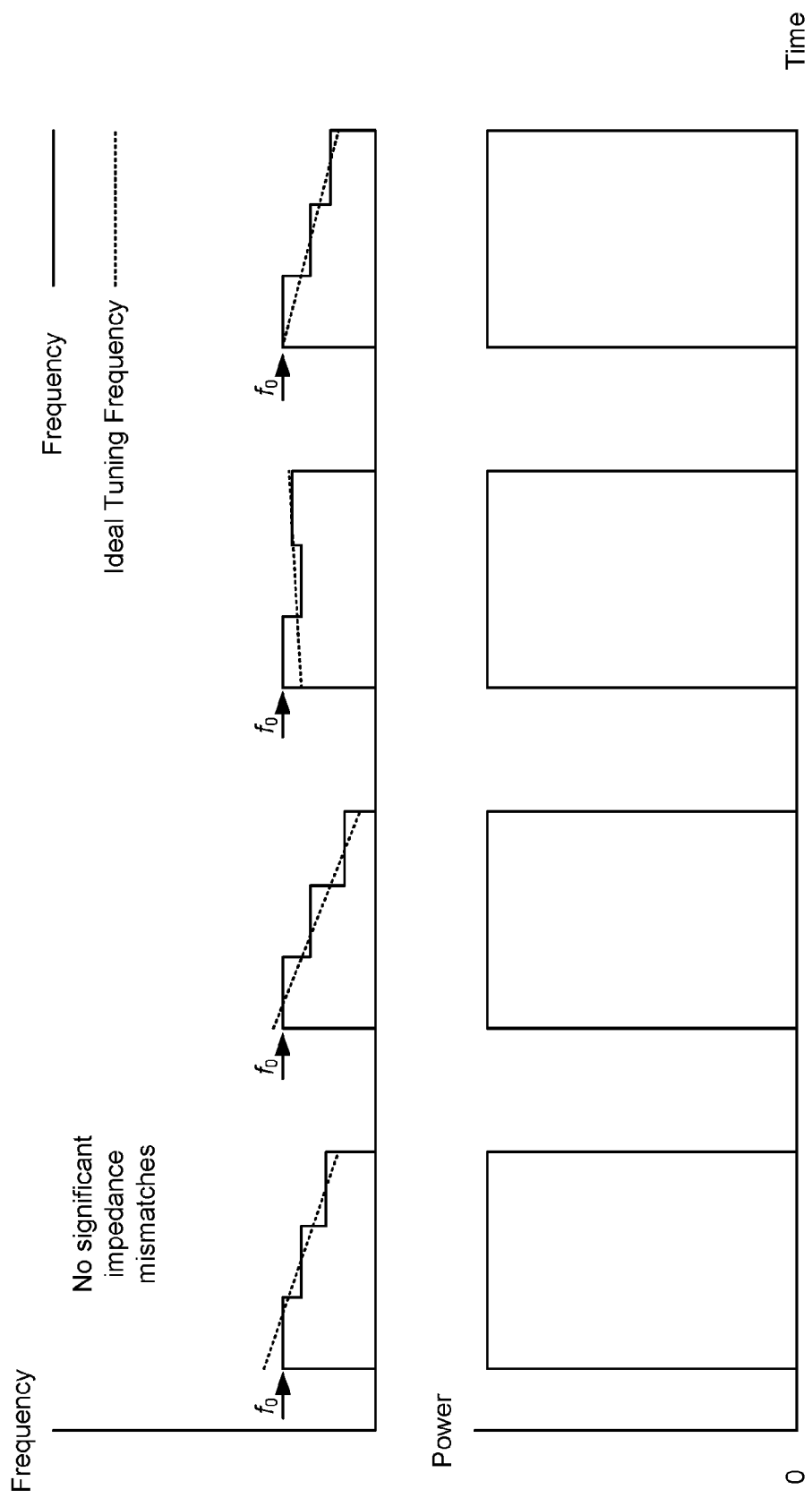
FIG. 4 shows a tuning regime where only three frequency set points per pulse are possible.

FIGS. 2 and 3 illustrate frequency tuning where rapid changes in frequency are possible. In other situations frequency tuning may be slower or the pulse envelopes may be faster, such that only a handful of frequency set points per pulse is possible. For instance, FIG. 4 shows a tuning regime where only three frequency set points per pulse are possible. Yet, the use of a fixed initial RF frequency, $f_0$, at a start to each pulse, prevents any significant impedance mismatches at the start of each pulse (similar to FIG. 3). Hence FIGS. 3 and 4 show that the herein described systems and methods can be applied to any system regardless as to the rapidity of frequency tuning.

Figure 1:
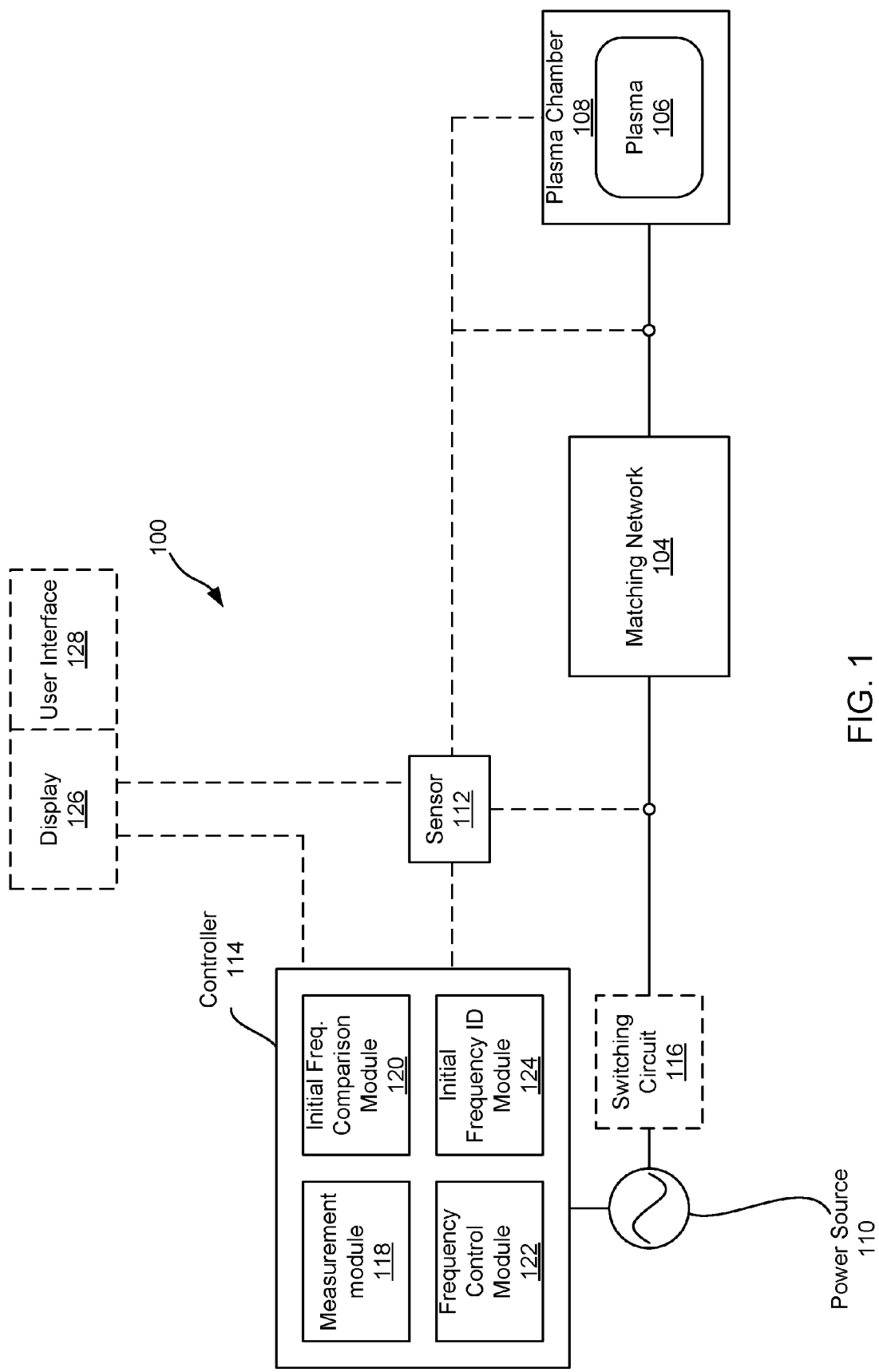
FIG. 1 illustrates a power generation system providing pulsed RF power to a plasma chamber via a matching network, where the pulsed RF power uses a fixed initial RF frequency at a start of each pulse.

FIG. 1 illustrates a power generation system providing pulsed RF power to a plasma chamber via a matching network, where the pulsed RF power uses a fixed initial RF frequency at a start of each pulse. The power generation system 100 can include a power source 110 providing pulsed RF power. Optionally, the power source 110 can provide RF power and an optional switching circuit 116 can pulse the RF power to generate pulsed RF power. The frequency of the RF, the frequency of the pulses, and a duty cycle of the pulses, among other things, can be controlled by a controller 114 (e.g., via one or more logical blocks). Further, the controller 114 can carry out frequency tuning of the pulsed RF power during each pulse. The controller 114 can also determine a fixed initial RF frequency, $f_0$, and instruct the power source 110 to use this fixed initial RF frequency at a start of each pulse.

In particular, a sensor 112 can sample a characteristic of the pulsed RF power (e.g., reflected power, delivered power, load impedance, plasma density, etc.) on either side of the matching network 104 or at the plasma chamber 108 when a dummy substrate or no substrate is in the plasma chamber 108 and the plasma 106 is ignited (during a calibration phase). The sensor 112 can provide these samples to a measurement module 118 of the controller 114, and the measurement module 118 can prepare the samples for an initial frequency comparison module 120 (e.g., by transforming the samples into a different data form, e.g., an analog-to-digital converter). The initial frequency comparison module 120 can compare the samples of the characteristic of the pulsed RF power at a start of each of a plurality of RF pulses to a desired characteristic of the pulsed RF power at a start of each of the plurality of pulses and via this comparison, the initial frequency comparison module 120 can determine an error value. During the calibration phase, a frequency control module 122 of the controller 114 can instruct the power source 110 to adjust the initial RF frequency at a start of each of a plurality of pulses based on the error value from the initial frequency comparison module 120. In particular, the frequency control module 122 can instruct the power source 110 to adjust the initial RF frequency at a start of each of a plurality of pulses, where the adjustments are tailored to minimize the error value.

As the error value decreases, an initial frequency identification module 124 eventually determines that further adjustments to the frequency of the power source 110 are failing to result in further reduction of the error value, and identifies the latest initial RF frequency as the fixed initial RF frequency to be used during an actual processing run (during a processing phase). In one embodiment, the initial frequency identification module 124 can identify when adjustment to the initial RF frequency at the start of two or more consecutive pulses fails to result in further reduction in the error value, and can then identify the last initial RF frequency as the fixed initial RF frequency for use during the processing phase. In some embodiments the initial frequency identification module 124 determines when two or more consecutive adjustments to the initial RF frequency fail to result in at least a threshold decrease in the error value, and then identifies a last initial RF frequency, or an average of a last few initial RF frequencies, as the fixed initial RF frequency for use during the processing phase. In yet another embodiment, the initial frequency identification module 124 determines that the initial RF frequency has reached a steady state, such that further adjustments to the initial RF frequency for consecutive pulses is not resulting in significant changes to the initial RF frequency or that a magnitude of adjustments to the initial RF frequency from pulse to pulse are consistently below a threshold (e.g., 1% of a magnitude of the initial RF frequency). For instance, where ten consecutive pulses each see less than 1% adjustments to the initial RF frequency, then the initial RF frequency can be deemed to have reached a steady state, and hence can be identified as the fixed initial RF frequency for use during the processing phase.

Once the fixed initial RF frequency is identified, a substrate can be loaded into the plasma chamber 108 and the controller 114 can cause the power source 110 to begin supplying power for the processing phase. In particular, the controller 114 can instruct the power source 110 to start each pulse using the fixed initial RF frequency, and can then perform real-time frequency tuning for the remainder of each pulse.

In some embodiments, the controller 114 and/or the sensor 112 can be in communication with an optional display 126 and an optional user interface 128. The sensor 112 can send samples of the pulsed RF power, or any characteristic indicative of delivered power (e.g., voltage and current or plasma density, to name two examples), to the display 126 for presentation to a user. Alternatively, the controller 114 can send this same information to the display 126 for presentation to a user. Alternatively, the controller 114 can receive the samples form the sensor 112 and convert the samples to a data stream that is more easily presentable to a user and then send this data stream to the display 126 for presentation to a user.

Such displaying of information can merely inform a user, or can be used to take further action. For instance, the user can use the user interface 128 to provide inputs for controlling the power source 110.

Figure 9:
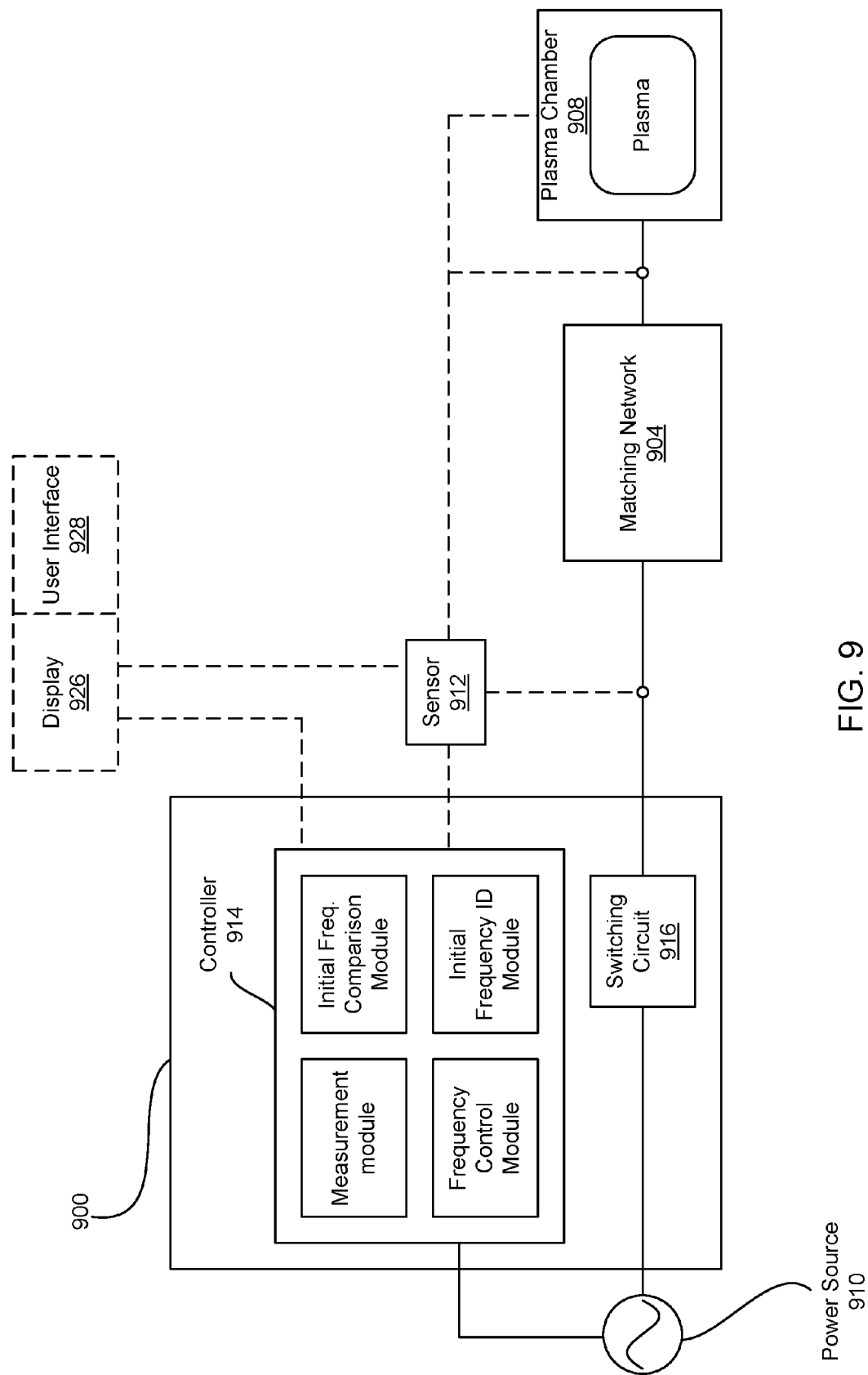
FIG. 9 illustrates another power generation system providing pulsed RF power to a plasma chamber via a matching network, where the pulsed RF power uses a fixed initial RF frequency at a start of each pulse.
Figure 10:
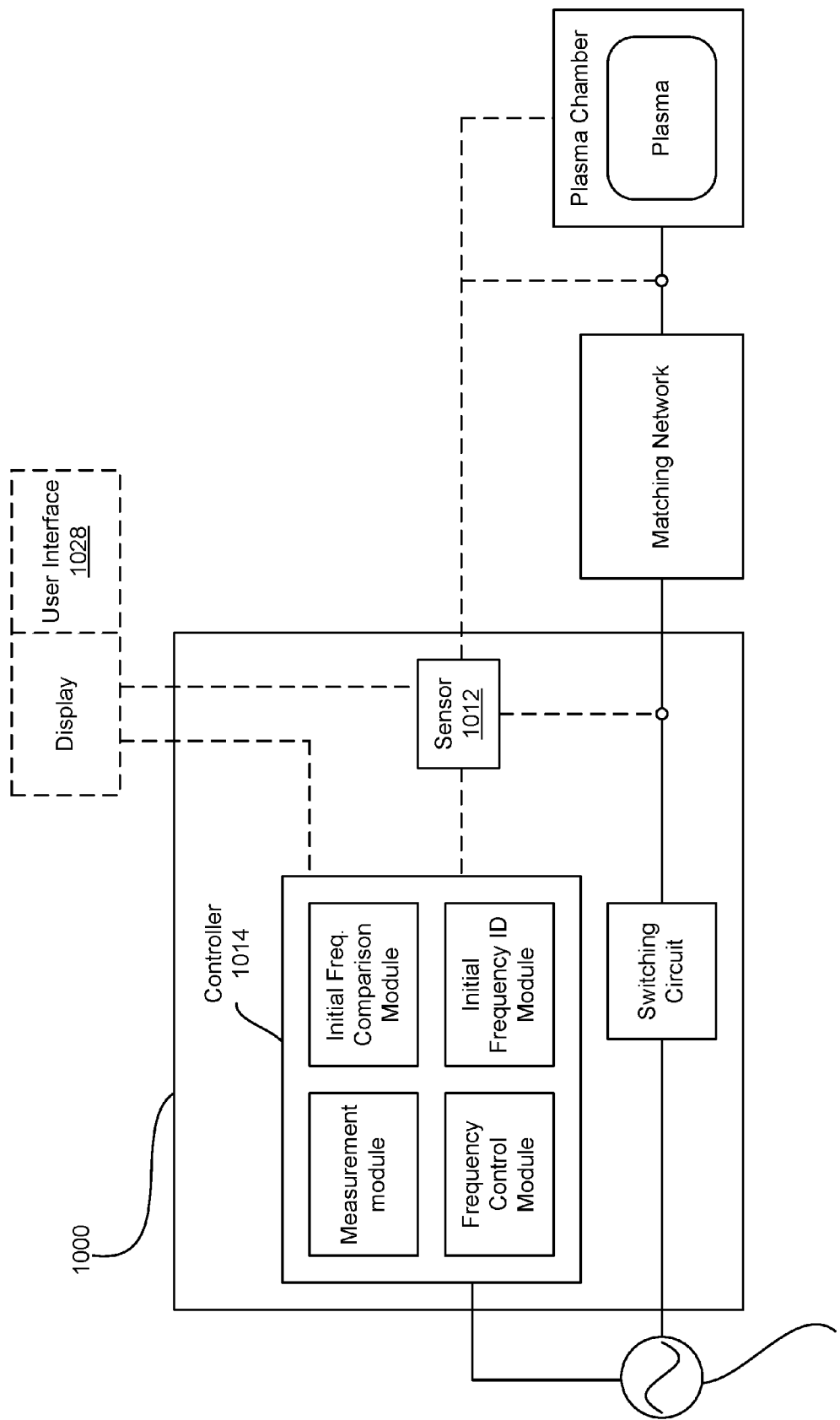
FIG. 10 illustrates yet another power generation system providing pulsed RF power to a plasma chamber via a matching network, where the pulsed RF power uses a fixed initial RF frequency at a start of each pulse.

FIG. 9 illustrates a power generation system 900 providing pulsed RF power to a plasma chamber 908 via a matching network 904, where the pulsed RF power uses a fixed initial RF frequency at a start of each pulse. The power generation system 900 includes a controller 914 and logic blocks as described in FIG. 1. The power generation system 900 further includes a switching circuit 916 that takes the AC power from the power source 910 and converts it to pulsed RF power. A sensor 912 can sample a characteristic indicative of delivered power and provide samples of the characteristic to either the system 900 (e.g., the controller 914) or a display 926 coupled to or including a user interface 928 (e.g., a keyboard, mouse, or touchscreen, to name a few). As seen, the sensor 912 can be arranged external to the power generation system 900, although this is not required, and as seen in FIG. 10, a sensor 1012 can be part of a power generation system 1000 and can sample the characteristic from within the system 1000.

In some embodiments, the sensor 112, 912, 1012 (and the display 126, 926, 1026) can be replaced with an oscilloscope (or an oscilloscope can include the sensor 112, 912, 1012) to provide feedback to a user regarding the characteristic indicative of delivered power (e.g., reflected power). A user may use readings visible on the oscilloscope to manually tune the initial RF frequency until the user identifies a frequency to use as the fixed initial RF frequency during the processing phase. In another embodiment, the sensor 112, 912, 1012 is not in direct communication with the controller 114 (e.g., the line connecting sensor 112, 912, 1012 with the controller 114, 914, 1014 is dotted/dashed and hence optional), and therefore manual analysis of data from the sensor 112, 912, 1012 is made followed by manual instructions being provided to the controller 114, 914, 1014 to adjust the initial RF frequency or select a last initial RF frequency (or an average of a last number of initial RF frequencies) as the fixed initial RF frequency. In other words, where the sensor 112, 912, 1012 is not in direct communication with the controller 114, 914, 1014, user analysis and control may be required. User inputs to control the initial RF frequency during a calibration phase or to set the fixed initial RF frequency during a processing phase can be made via the user interface 128, 928, 1028.

Figure 5:
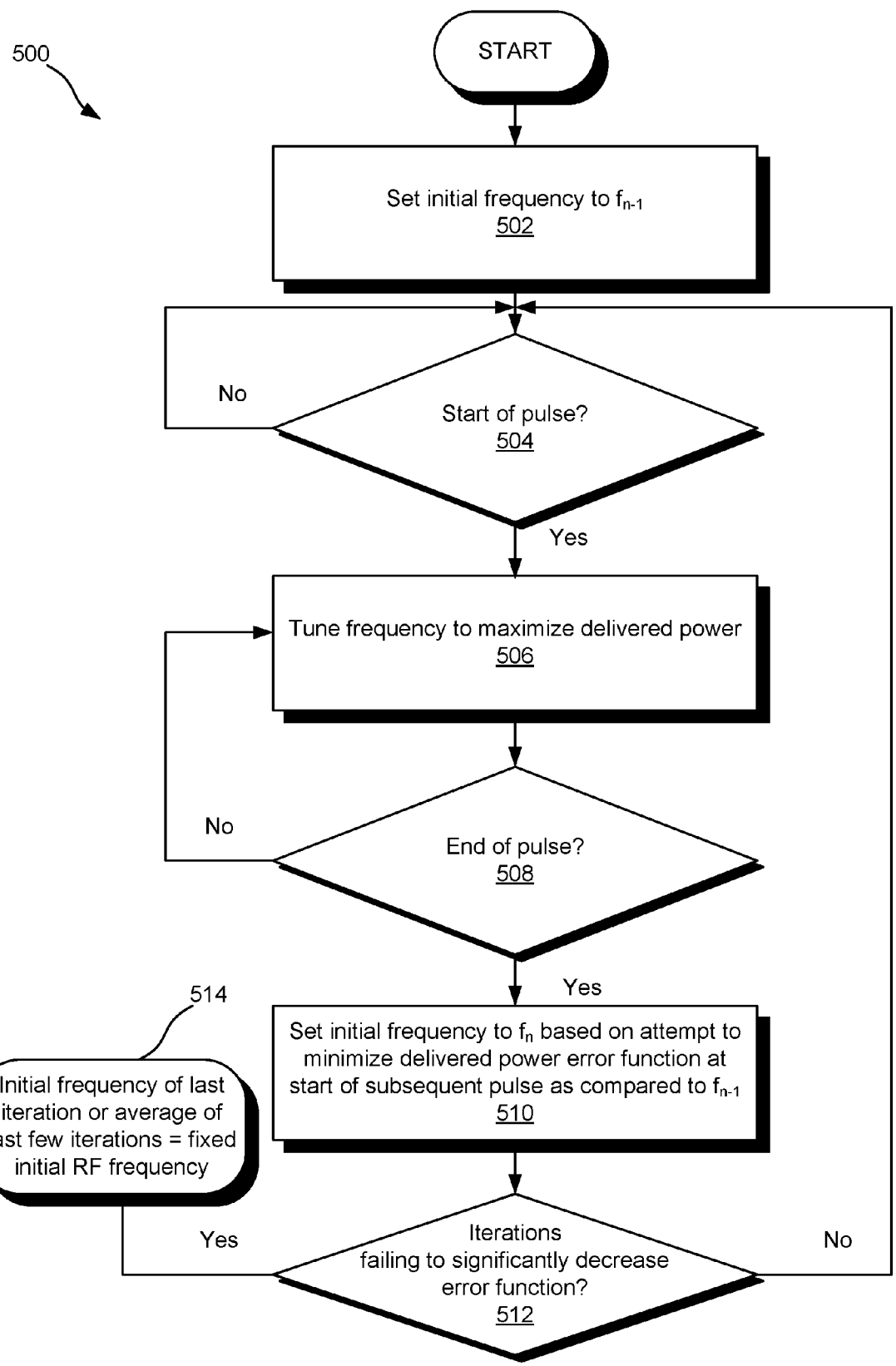
FIG. 5 illustrates a method of frequency tuning RF pulsed power to a plasma load during a calibration phase.

FIG. 5 illustrates a method of frequency tuning RF pulsed power to a plasma load during a calibration phase. The method 500 provides pulsed RF power to a plasma load where the RF has a controllable frequency. As this method 500 involves a calibration phase, the pulsed RF power is provided to a plasma load where the plasma operates on a dummy substrate or where no substrate is in the plasma chamber. The method 500 sets an initial RF frequency ($f_{n-1}$) at a start of a pulse (Block 502) so that the initial RF frequency is applied at a start of a pulse. Once a start of a pulse is identified (Decision 504), the method 500 tunes the RF frequency to maximize delivered power or some other characteristic indicative of delivered power (Block 506) until an end of the pulse (Decision 508). After the pulse has ended, the method 500 again sets the initial frequency to a different frequency ($f_n$) in an attempt to minimize an error function for delivered power (e.g., a difference between actual and desired delivered power) (Block 510). Power is applied at this new frequency, $f_n$, at the start of the next pulse (Decision 504), and then the frequency is tuned to maximize delivered power or another characteristic indicative of delivered power for a remainder of the next pulse (Block 506). At the end of this next pulse (Decision 508), the method 500 again adjusts the initial frequency in an attempt to further minimize the error function for delivered power (Block 510). This series of operations continues to repeat until further iterations fail to result in significant reduction to the error function (Decision 512), at which point the initial frequency can be identified as the fixed initial RF frequency that is to be used during the processing phase (Block 514 and see FIG. 6).

In some embodiments the tuning for a remainder of each pulse (Block 506) can be automated while in others it can be manual. Automated tuning involves a sensor providing samples of a characteristic, and a controller tuning the RF frequency based on the samples of the characteristic. Manual operation might see a user observing the samples (e.g., on a display in communication with the sensor or on an oscilloscope directly monitoring the characteristic with or without a separate sensor) and manually adjusting the initial RF frequency at a start of each pulse according to the data that is visible to the user. A user cannot tune as rapidly as an automated system, so the user may not adjust the initial RF frequency every pulse, but instead may only be able to adjust the initial RF frequency every thousand pulses. The method will still be effective, and once a fixed initial RF frequency is manually identified, this frequency can be used as a setpoint for a processing phase.

Figure 6:
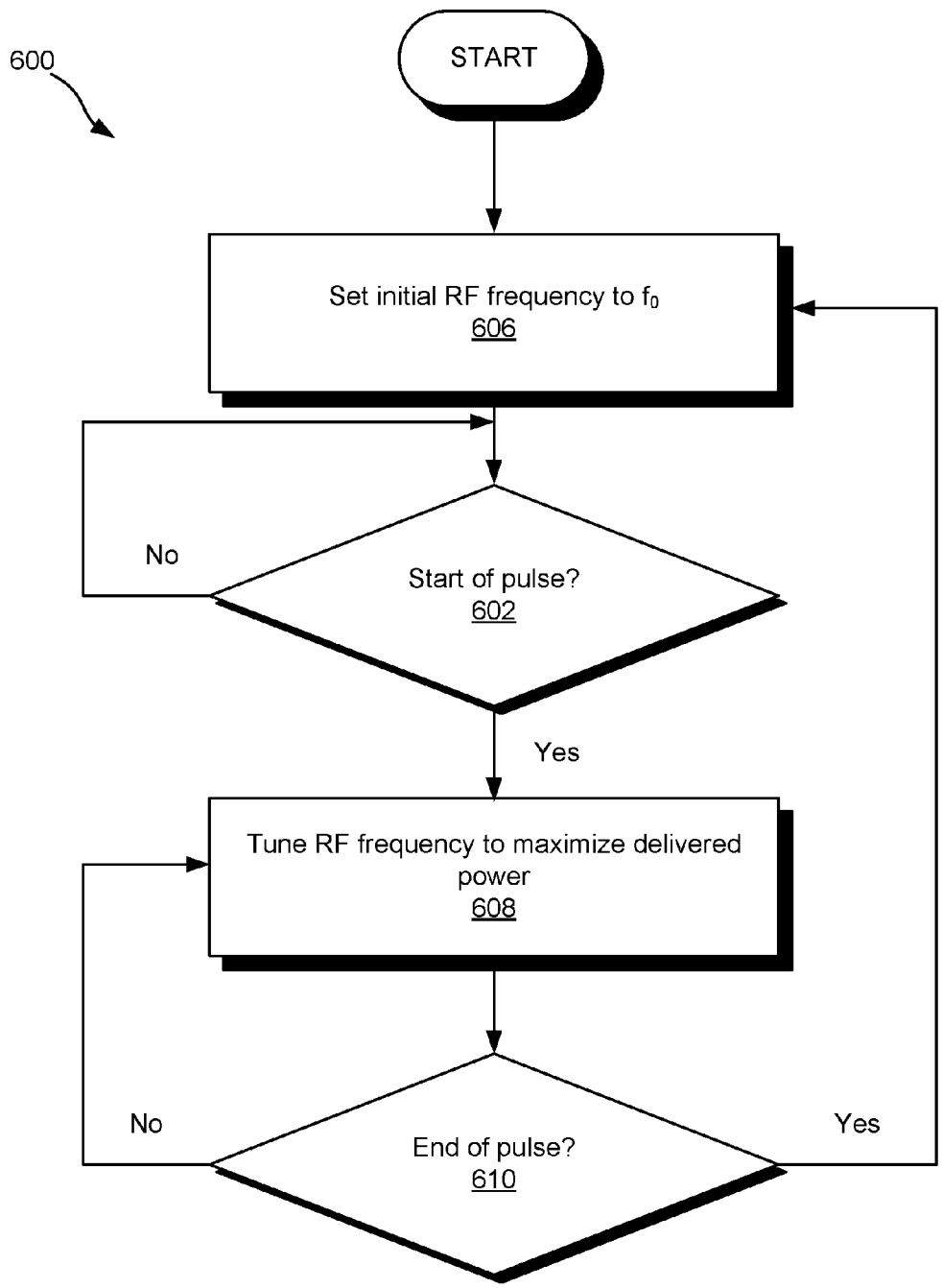
FIG. 6 illustrates a method of frequency tuning RF pulsed power to a plasma load during a processing phase.

FIG. 6 illustrates a method of frequency tuning RF pulsed power to a plasma load during a processing phase. The method 600 involves providing pulsed RF power to a plasma load, where each pulse comprises RF power having a controllable frequency, and where a plasma having the plasma load processes a substrate in a plasma chamber (e.g., the processing phase). The method 600 sets a fixed initial RF frequency to $f_0$ (Block 606), a frequency that is fixed for the start of all pulses. After the start of a pulse (Decision 602), the method tunes the RF frequency to maximize delivered power or a characteristic indicative of delivered power (Block 608) until an end of the pulse (Decision 610). Once the pulse has ended, the method resets the initial RF frequency to $f_0$ and repeats for the next pulse. In this way, a fixed initial RF frequency, $f_0$, is set at the start of each pulse and is fixed from pulse to pulse regardless as to the frequency tuning that occurs during a remainder of each pulse.

Figure 7:
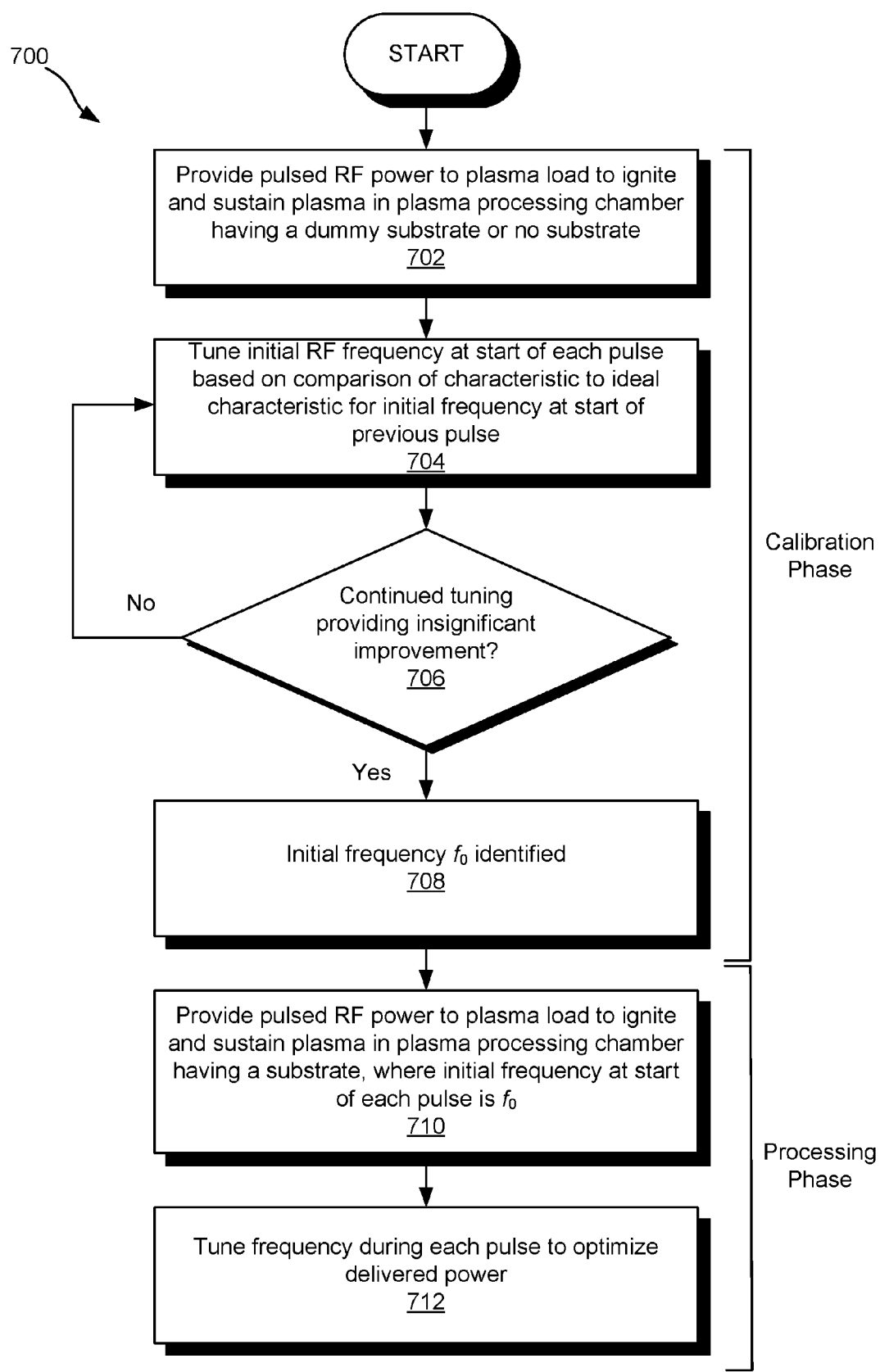
FIG. 7 illustrates a method of frequency tuning RF pulsed power to a plasma load during both a calibration phase and a processing phase.

FIG. 7 illustrates a method of frequency tuning RF pulsed power to a plasma load during both a calibration phase and a processing phase. The method 700 involves two phases: a calibration phase and a processing phase. The calibration phase identifies a fixed initial RF frequency, $f_0$, for pulsed RF power, while the processing phase uses the fixed initial RF frequency, $f_0$, at a start of each pulse to process a substrate. The method 700 starts by providing pulsed RF power to a plasma to ignite and sustain the plasma in a plasma processing chamber having a dummy substrate or no substrate (Block 702) (a start of the calibration phase). The method 700 then tunes the initial frequency over the course of multiple RF pulses by repeatedly adjusting the RF frequency at a start of a plurality of consecutive pulses of RF power delivered to the plasma load (Block 704). The adjusting is performed to optimize a characteristic indicative of delivered power at a start of each pulse as compared from pulse to pulse. When continued tuning ceases to provide significant improvements to the optimization (Decision 706), then the method 700 identifies this frequency as the fixed initial RF frequency, $f_0$ (Block 708).

The method 700 then enters the processing phase, where a substrate is loaded into the plasma processing chamber and an actual processing run is carried out on the substrate. The method 700 provides pulsed RF power to the plasma load to ignite and sustain the plasma with the substrate in the chamber, where the initial RF frequency at a start of each pulse is the fixed initial RF frequency, $f_0$. The remainder of each pulse can involve tuning the frequency of the RF power to minimize a difference between a characteristic of the pulsed RF power and a desired characteristic of the pulsed RF power.

In each of the figures, the use of dotted or dashed lines as compared to solid lines, indicates optional components or features. At the same time, any components or features shown with solid lines are not necessarily required.

While this disclosure has focused on embodiments where frequency tuning at the power source is used to optimize delivered power, in some variations, the methods of tuning can be applied to the matching network. In particular, where a matching network having a fast enough impedance adjustment mechanism is used, the match can be used to tune impedance during each pulse, and the match can return to a same impedance at a start of each pulse. Further, the fixed initial impedance can be identified via tuning in a calibration phase where a dummy substrate or no substrate is used.

Figure 8:
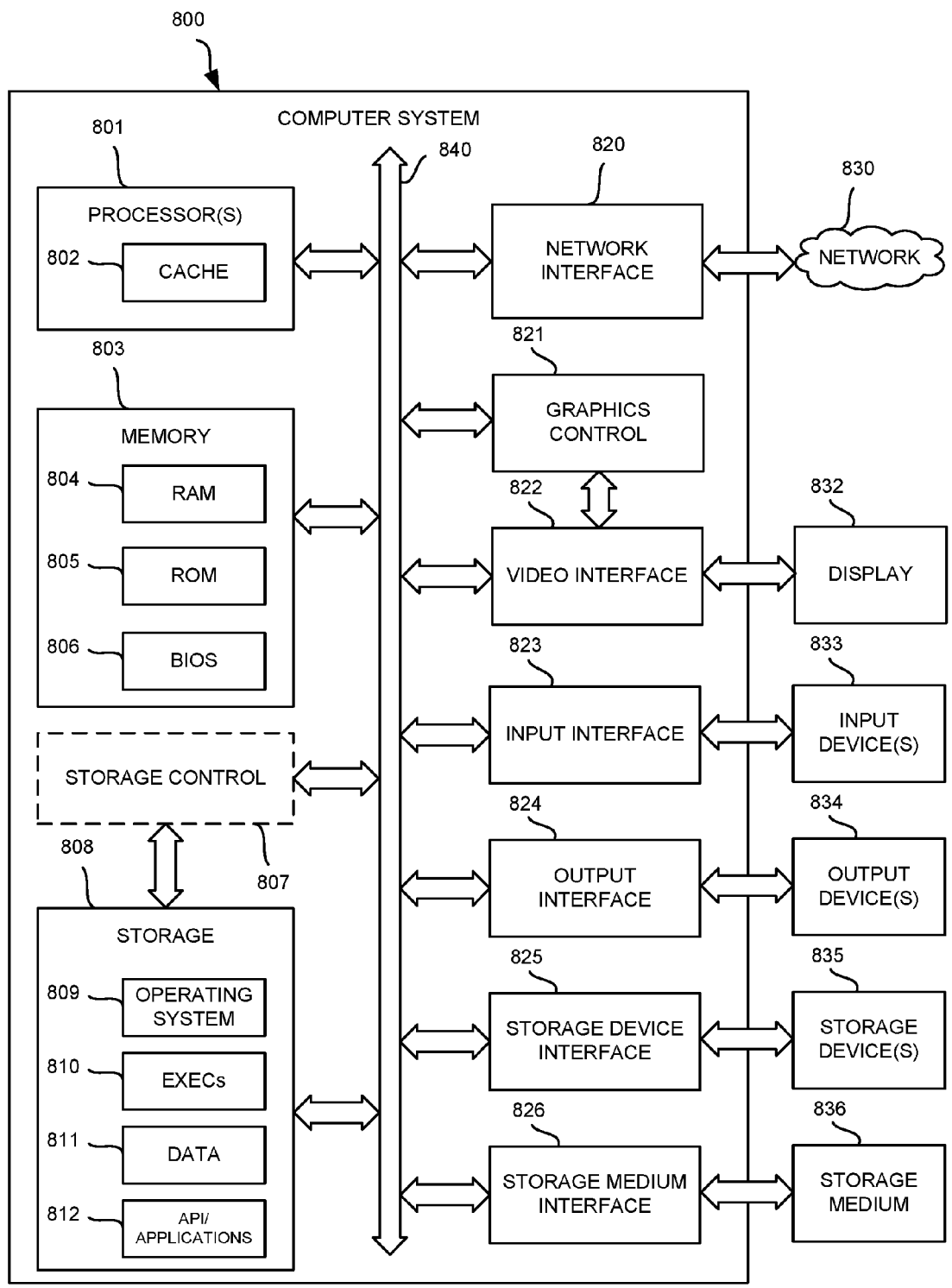
FIG. 8 shows a diagrammatic representation of one embodiment of a computer system.

The systems and methods described herein can be implemented in a computer system in addition to the specific physical devices described herein. FIG. 8 shows a diagrammatic representation of one embodiment of a computer system 800 within which a set of instructions can execute for causing a device to perform or execute any one or more of the aspects and/or methodologies of the present disclosure. Controller 114 in FIG. 1 is one implementation of the computer system 800 or can be a component within an implementation of the computer system 800. The components in FIG. 8 are examples only and do not limit the scope of use or functionality of any hardware, software, firmware, embedded logic component, or a combination of two or more such components implementing particular embodiments of this disclosure. Some or all of the illustrated components can be part of the computer system 800. For instance, the computer system 800 can be a general purpose computer (e.g., a laptop computer) or an embedded logic device (e.g., an FPGA), to name just two non-limiting examples.

Computer system 800 includes at least a processor 801 such as a central processing unit (CPU) or an FPGA to name two non-limiting examples. Controller 114 in FIG. 1 is one implementation of the processor 801. The computer system 800 may also comprise a memory 803 and a storage 808, both communicating with each other, and with other components, via a bus 840. The bus 840 may also link a display 832, one or more input devices 833 (which may, for example, include a keypad, a keyboard, a mouse, a stylus, etc.), one or more output devices 834, one or more storage devices 835, and various non-transitory, tangible computer-readable storage media 836 with each other and with one or more of the processor 801, the memory 803, and the storage 808. All of these elements may interface directly or via one or more interfaces or adaptors to the bus 840. For instance, the various non-transitory, tangible computer-readable storage media 836 can interface with the bus 840 via storage medium interface 826. Computer system 800 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 801 (or central processing unit(s) (CPU(s))) optionally contains a cache memory unit 802 for temporary local storage of instructions, data, or computer addresses. Processor(s) 801 are configured to assist in execution of computer-readable instructions stored on at least one non-transitory, tangible computer-readable storage medium. Computer system 800 may provide functionality as a result of the processor(s) 801 executing software embodied in one or more non-transitory, tangible computer-readable storage media, such as memory 803, storage 808, storage devices 835, and/or storage medium 836 (e.g., read only memory (ROM)). For instance, the method 500 in FIG. 5 or the method 600 in FIG. 6 may be embodied in one or more non-transitory, tangible computer-readable storage media. The non-transitory, tangible computer-readable storage media may store software that implements particular embodiments, such as the methods 500, 600, and 700, and processor(s) 801 may execute the software. Memory 803 may read the software from one or more other non-transitory, tangible computer-readable storage media (such as mass storage device(s) 835, 836) or from one or more other sources through a suitable interface, such as network interface 820. The software may cause processor(s) 801 to carry out one or more processes or one or more steps of one or more processes described or illustrated herein. Carrying out such processes or steps may include defining data structures stored in memory 803 and modifying the data structures as directed by the software. In some embodiments, an FPGA can store instructions for carrying out functionality as described in this disclosure (e.g., the methods 500, 600, and 700). In other embodiments, firmware includes instructions for carrying out functionality as described in this disclosure (e.g., the methods 500, 600, and 700).

The memory 803 may include various components (e.g., non-transitory, tangible computer-readable storage media) including, but not limited to, a random access memory component (e.g., RAM 804) (e.g., a static RAM "SRAM", a dynamic RAM "DRAM, etc.), a read-only component (e.g., ROM 805), and any combinations thereof. ROM 805 may act to communicate data and instructions unidirectionally to processor(s) 801, and RAM 804 may act to communicate data and instructions bidirectionally with processor(s) 801. ROM 805 and RAM 804 may include any suitable non-transitory, tangible computer-readable storage media described below. In some instances, ROM 805 and RAM 804 include non-transitory, tangible computer-readable storage media for carrying out the methods 500, 600, and 700. In one example, a basic input/output system 806 (BIOS), including basic routines that help to transfer information between elements within computer system 800, such as during start-up, may be stored in the memory 803.

Fixed storage 808 is connected bidirectionally to processor(s) 801, optionally through storage control unit 807. Fixed storage 808 provides additional data storage capacity and may also include any suitable non-transitory, tangible computer-readable media described herein. Storage 808 may be used to store operating system 809, EXECs 810 (executables), data 811, API applications 812 (application programs), and the like. For instance, the storage 808 could be implemented for storage of the fixed initial RF frequency, $f_0$, as described in FIGS. 1-7 and 9-10. Often, although not always, storage 808 is a secondary storage medium (such as a hard disk) that is slower than primary storage (e.g., memory 803). Storage 808 can also include an optical disk drive, a solid-state memory device (e.g., flash-based systems), or a combination of any of the above. Information in storage 808 may, in appropriate cases, be incorporated as virtual memory in memory 803.

In one example, storage device(s) 835 may be removably interfaced with computer system 800 (e.g., via an external port connector (not shown)) via a storage device interface 825. Particularly, storage device(s) 835 and an associated machine-readable medium may provide nonvolatile and/or volatile storage of machine-readable instructions, data structures, program modules, and/or other data for the computer system 800. In one example, software may reside, completely or partially, within a machine-readable medium on storage device(s) 835. In another example, software may reside, completely or partially, within processor(s) 801.

Bus 840 connects a wide variety of subsystems. Herein, reference to a bus may encompass one or more digital signal lines serving a common function, where appropriate. Bus 840 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 800 may also include an input device 833. In one example, a user of computer system 800 may enter commands and/or other information into computer system 800 via input device(s) 833. Examples of an input device(s) 833 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 833 may be interfaced to bus 840 via any of a variety of input interfaces 823 (e.g., input interface 823) including, but not limited to, serial, parallel, game port, USB, FIREWIRE, THUNDERBOLT, or any combination of the above.

In particular embodiments, when computer system 800 is connected to network 830, computer system 800 may communicate with other devices, such as mobile devices and enterprise systems, connected to network 830. Communications to and from computer system 800 may be sent through network interface 820. For example, network interface 820 may receive incoming communications (such as requests or responses from other devices) in the form of one or more packets (such as Internet Protocol (IP) packets) from network 830, and computer system 800 may store the incoming communications in memory 803 for processing. Computer system 800 may similarly store outgoing communications (such as requests or responses to other devices) in the form of one or more packets in memory 803 and communicated to network 830 from network interface 820. Processor(s) 801 may access these communication packets stored in memory 803 for processing.

Examples of the network interface 820 include, but are not limited to, a network interface card, a modem, and any combination thereof. Examples of a network 830 or network segment 830 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 830, may employ a wired and/or a wireless mode of communication. In general, any network topology may be used.

Information and data can be displayed through a display 832. Examples of a display 832 include, but are not limited to, a liquid crystal display (LCD), an organic liquid crystal display (OLED), a cathode ray tube (CRT), a plasma display, and any combinations thereof. The display 832 can interface to the processor(s) 801, memory 803, and fixed storage 808, as well as other devices, such as input device(s) 833, via the bus 840. The display 832 is linked to the bus 840 via a video interface 822, and transport of data between the display 832 and the bus 840 can be controlled via the graphics control 821.

In addition to a display 832, computer system 800 may include one or more other peripheral output devices 834 including, but not limited to, an audio speaker, a printer, and any combinations thereof. Such peripheral output devices may be connected to the bus 840 via an output interface 824. Examples of an output interface 824 include, but are not limited to, a serial port, a parallel connection, a USB port, a FIREWIRE port, a THUNDERBOLT port, and any combinations thereof.

In addition or as an alternative, computer system 800 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a non-transitory, tangible computer-readable medium may encompass a circuit (such as an IC) storing software for execution, a circuit embodying logic for execution, or both, where appropriate. The present disclosure encompasses any suitable combination of hardware, software, or both.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Within this specification, the same reference characters are used to refer to terminals, signal lines, wires, etc. and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, or microcontroller. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein (e.g., the methods 500, 600, and 700) may be embodied directly in hardware, in a software module executed by a processor, a software module implemented as digital logic devices, or in a combination of these. A software module may reside in RAM memory, flash memory, ROM memory, EPROM memory, EEPROM memory, registers, hard disk, a removable disk, a CD-ROM, or any other form of non-transitory, tangible computer-readable storage medium known in the art. An exemplary non-transitory, tangible computer-readable storage medium is coupled to the processor such that the processor can read information from, and write information to, the non-transitory, tangible computer-readable storage medium. In the alternative, the non-transitory, tangible computer-readable storage medium may be integral to the processor. The processor and the non-transitory, tangible computer-readable storage medium may reside in an ASIC. The ASIC may reside in a user terminal. In the alternative, the processor and the non-transitory, tangible computer-readable storage medium may reside as discrete components in a user terminal. In some embodiments, a software module may be implemented as digital logic components such as those in an FPGA once programmed with the software module.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method comprising:
providing pulsed RF power to a plasma load, where each pulse comprises RF power having a controllable frequency;
tuning an initial RF frequency for each pulse in a string of pulses, in a calibration phase, by reducing a difference between a characteristic indicative of the pulsed RF power and a desired characteristic of the pulsed RF power, at a start of consecutive pulses, until the difference is below a threshold; then selecting the initial RF frequency as a fixed initial RF frequency for use in a processing phase using a substrate different than a substrate used during the calibration run; and tuning the RF frequency during the processing phase within each pulse but returning to the fixed initial RF frequency at a start of each pulse.

2. The method of claim 1, wherein the characteristic indicative of the pulsed RF power is reflected power.

3. The method of claim 1, wherein the characteristic indicative of the pulsed RF power is load impedance power.

4. The method of claim 1, wherein the characteristic indicative of the pulsed RF power is a density of the plasma.

5. A non-transitory, tangible computer readable storage medium, encoded with processor readable instructions to perform a method for frequency tuning, the method comprising:

in a calibration phase,
tuning an initial RF frequency at a start of each pulse in a string of RF pulses, until a difference between a characteristic indicative of power and a desired characteristic of the power at the start of two consecutive pulses in the string, is below a threshold; then selecting the initial RF frequency as a fixed initial RF frequency to be used during a processing phase; and in the processing phase,
setting an initial RF frequency for all pulses in the processing phase equal to the fixed initial RF frequency selected during the calibration phase; and tuning the RF frequency during each pulse, but returning to the fixed initial RF frequency at a start of each pulse.

6. The non-transitory, tangible computer readable storage medium of claim 5, wherein the characteristic indicative of power is reflected power.

7. The non-transitory, tangible computer readable storage medium of claim 5, wherein the characteristic indicative of power is load impedance power.

8. The non-transitory, tangible computer readable storage medium of claim 5, wherein the characteristic indicative of power is a density of the plasma.

9. A power delivery system comprising:
a power source configured to provide pulsed RF power to a plasma load;
a sensor configured to sample a characteristic indicative of the pulsed RF power;
a controller in communication with the sensor and the power source and executable to:
in a calibration phase,
tune an initial RF frequency at a start of each pulse in a string of RF pulses, until a difference between the characteristic indicative of the pulsed RF power and a desired characteristic of the power at the start of consecutive pulses in the string, is below a threshold; then select the initial RF frequency as a fixed initial RF frequency to be used during a processing phase; and in the processing phase,
set an initial RF frequency for all pulses in the processing phase equal to the fixed initial RF frequency selected during the calibration phase; and tune the RF frequency of pulsed RF power during each pulse, but return to the fixed initial RF frequency at a start of each pulse.

10. The power delivery system of claim 9, wherein the sensor is a reflected power sensor.

11. The power delivery system of claim 10, wherein the sensor is a directional coupler.

12. The power delivery system of claim 9, wherein the sensor is a delivered power sensor.

13. The power delivery system of claim 9, wherein the sensor is an impedance sensor.

14. The power delivery system of claim 9, wherein the sensor is a plasma density sensor.

15. The power delivery system of claim 9, wherein the power source is in communication with a switching circuit that converts the RF power to the pulsed RF power.

16. The power delivery system of claim 9, wherein the sensor is part of an oscilloscope.

17. The power delivery system of claim 9, wherein the power source is configured to provide the pulsed RF power to a plasma load via a matching network.

* * * * *